US008068663B2

(12) United States Patent
Takahashi et al.

(10) Patent No.: US 8,068,663 B2
(45) Date of Patent: Nov. 29, 2011

(54) SIMULATION METHOD OF OPTICAL IMAGE INTENSITY DISTRIBUTION, PROGRAM, AND METHOD OF MANUFACTURING SEMICONDUCTOR DEVICE

(75) Inventors: Masanori Takahashi, Kanagawa-ken (JP); Satoshi Tanaka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 780 days.

(21) Appl. No.: 12/187,589

(22) Filed: Aug. 7, 2008

(65) Prior Publication Data
US 2009/0041382 A1 Feb. 12, 2009

(30) Foreign Application Priority Data

Aug. 10, 2007 (JP) .................................. 2007-209845

(51) Int. Cl.
*G06K 9/00* (2006.01)

(52) U.S. Cl. .......... 382/144; 382/145; 382/280; 716/50; 716/51; 716/52; 716/53; 716/54; 716/55; 430/5; 430/14; 430/30

(58) Field of Classification Search .................. None
See application file for complete search history.

(56) References Cited

U.S. PATENT DOCUMENTS

| | | | | |
|---|---|---|---|---|
| 5,448,336 | A * | 9/1995 | Shiraishi | 355/71 |
| 6,088,059 | A * | 7/2000 | Mihara et al. | 348/335 |
| 6,607,274 | B2 * | 8/2003 | Stantz et al. | 351/221 |
| 7,494,753 | B2 * | 2/2009 | Chen et al. | 430/30 |
| 7,921,383 | B1 * | 4/2011 | Wei | 716/136 |
| 2004/0009413 | A1 * | 1/2004 | Lizotte | 430/5 |
| 2005/0204322 | A1 * | 9/2005 | Kotani et al. | 716/10 |
| 2005/0229125 | A1 * | 10/2005 | Tabery et al. | 716/5 |
| 2005/0260508 | A1 * | 11/2005 | Lizotte | 430/5 |
| 2006/0034505 | A1 * | 2/2006 | Luk-Pat et al. | 382/144 |
| 2006/0208205 | A1 * | 9/2006 | Chen et al. | 250/492.22 |
| 2006/0248497 | A1 * | 11/2006 | Huang et al. | 716/21 |
| 2006/0269875 | A1 * | 11/2006 | Granik | 430/311 |
| 2007/0198963 | A1 * | 8/2007 | Granik et al. | 716/19 |
| 2007/0224526 | A1 * | 9/2007 | Brunner et al. | 430/30 |
| 2008/0134131 | A1 * | 6/2008 | Asano et al. | 716/21 |

OTHER PUBLICATIONS

Tsudaka et al., "A Fast Resist Image Estimation Methodology Using Light Intensity Distribution", SPIE vol. 2512 (Jul. 3, 1995), pp. 384-395. Inui et al., "A Practical 3D Lithography Simulation System", SPIE vol. 3051 (Jul. 7, 1997), pp. 522-529.

* cited by examiner

*Primary Examiner* — Anand Bhatnagar
*Assistant Examiner* — Tsung-Yin Tsai
(74) *Attorney, Agent, or Firm* — Finnegan, Henderson, Farabow, Garrett & Dunner, L.L.P.

(57) ABSTRACT

The intensity distribution of an optical image in a resist film is calculated (S1); the intensity distribution of the optical image is transformed through a Fourier transform in a periodic direction of the intensity distribution of the optical image (S2) and is transformed through a spectral transform in an aperiodic direction of the intensity distribution of the optical image by use of a base which satisfies a boundary condition (S3); a modulation function for modulating the intensity distribution of the optical image is transformed through a Fourier transform in the periodic direction (S4) and is transformed through a spectral transform in the aperiodic direction by use of the base satisfying the boundary direction (S5); a product of the post-transformed intensity distribution of the optical image and the post-transformed modulation function is computed (S6), is transformed through an inverse Fourier transform in the periodic direction (S7), and is transformed through an inverse spectral transform in the aperiodic direction by use of a base corresponding to the inverse transform of the spectral transform; and thereby a modulated intensity distribution of the optical image is calculated (S8).

6 Claims, 6 Drawing Sheets

FILM THICKNESS DIRECTION
OF RESIST FILM

FILM THICKNESS DIRECTION
OF RESIST FILM

SIMULATION METHOD OF OPTICAL IMAGE INTENSITY DISTRIBUTION, PROGRAM, AND METHOD OF MANUFACTURING SEMICONDUCTOR DEVICE

CROSS-REFERENCE TO RELATED APPLICATIONS

This application is based upon and claims the benefit of priority from prior Japanese Patent Application No. P2007-209845, filed Aug. 10, 2007, the entire contents of which are incorporated herein by reference.

BACKGROUND OF THE INVENTION

1. Field of the Invention

The present invention relates to a method and program both for simulating the intensity distribution of an optical image, and particularly relates to a simulation method and program used for calculating the intensity distribution of an optical image to estimate the shape of a resist pattern to be formed in a lithography step of semiconductor device manufacturing. In addition, the present invention relates to a method of manufacturing semiconductor device using a pattern data generating method using this simulation method.

2. Description of the Related Art

When semiconductor devices are manufactured, a simulation technique is used to calculate the intensity distribution of an optical image to be formed in a resist film or the like on a substrate by photolithography. A lithography simulation calculates the intensity distribution of the optical image on the basis of optical conditions (for example, the wavelength of exposure light, the numerical aperture of a lens in a projection optical system, and an illumination shape) in the exposure system and information (for example, the indices of refraction and the thicknesses of films) on multiple films on the substrate. Moreover, the lithography simulation calculates the resist pattern in consideration of processes such as photoreaction, PEB (Post-exposure Bake) and development.

For the purpose of enabling the simulation to accurately calculate the intensity distribution of the optical image to be formed in the resist film, it is necessary to find a diffusant concentration distribution formed by a diffusant such as an acid diffusing in the resist film. A diffusion equation needs to be solved in order to find the concentration distribution. The diffusion equation is generally solved based on a solution using a difference method in which an arbitrary boundary condition can be used. If, however, the concentration distribution is intended to be found with high accuracy by use of the difference method, an associated problem is that the difference method consumes a larger amount of time for its calculation.

On the other hand, a proposal has been made on a method of fast and accurately solving the diffusion equation by use of a fast Fourier transform (see SPIE 2512-384, "A fast resist image estimation methodology using light intensity distribution," for example). However, the fast Fourier transform needs to be applied to a system that satisfies a periodic boundary condition. For this reason, in a case where the intensity distribution of an optical image satisfies no periodic boundary condition, the fast Fourier transform can not be applied to simulate the intensity distribution.

Furthermore, another proposal has been made on a technique of expanding a resist film area where an optical image is to be formed for the purpose of satisfying the periodic boundary condition (see SPIE 3051-522, "A practical 3D lithography simulation system," for example). A problem associated with this technique is that the application of the fast Fourier transform to the lithography simulation causes aliasing at the boundary part between the expanded resist film area and the original resist film area, and thus modulates the entire distribution. For this reason, the technique entails a problem that the application of the fast Fourier transform to such a lithography simulation is apt to decrease the accuracy.

SUMMARY OF THE INVENTION

The present invention has been made for the purpose of solving the above-mentioned problems. An object of the present invention is to provide a simulation method and program which are capable of fast and accurately estimating the intensity distribution of an optical image to be formed in a resist film, and to provide a method for fast and accurately generating pattern data by use of the simulation method.

For the purpose of achieving the foregoing object, a method for simulating the intensity distribution of an optical image according to a first aspect of the present invention is characterized by including the steps of: applying a Fourier transform to the intensity distribution of the optical image formed in a resist in a periodic direction of the intensity distribution of the optical image, and applying a spectral transform to the intensity distribution of the optical image in an aperiodic direction of the intensity distribution of the optical image by use of a base which satisfies a boundary condition; applying a Fourier transform to a modulation function for modulating the intensity distribution of the optical image, in the periodic direction of the intensity distribution of the optical image, and applying a spectral transform to the modulation function in the aperiodic direction of the intensity distribution of the optical image by use of the base which satisfies the boundary condition; computing a product of the post-transformed intensity distribution of the optical image and the post-transformed modulation function; applying an inverse Fourier transform to the thus-found product in the periodic direction of the intensity distribution of the optical image, and applying an inverse spectral transform to the resultant product in the aperiodic direction of the intensity distribution of the optical image by use of a base corresponding to the inverse transform of the spectral transform, thereby calculating a modulated intensity distribution of the optical image; and estimating the shape of a pattern to be formed in the resist film, on the basis of the thus-modulated intensity distribution of the optical image.

A program for simulating the intensity distribution of an optical image according to another aspect of the present invention is characterized by causing a computer to execute the steps of: applying a Fourier transform to the intensity distribution of the optical image formed in a resist in a periodic direction of the intensity distribution of the optical image, and applying a spectral transform to the intensity distribution of the optical image in an aperiodic direction of the intensity distribution of the optical image by use of a base which satisfies a boundary condition; applying a Fourier transform to a modulation function for modulating the intensity distribution of the optical image, in the periodic direction of the intensity distribution of the optical image, and applying a spectral transform to the modulation function in the aperiodic direction of the intensity distribution of the optical image by use of the base which satisfies the boundary condition; computing a product of the post-transformed intensity distribution of the optical image and the post-transformed modulation function; applying an inverse Fourier transform to the thus-found product in the periodic direction of the intensity distribution of the optical image, and applying an inverse spectral transform to the resultant product in the aperiodic direction of the intensity distribution of the optical image by use of a base corresponding to the inverse transform of the spectral transform, thereby calculating a modulated intensity distribution of the optical image; and on the basis of the thus-modulated intensity distribution of the optical image, estimating the shape of a pattern to be formed in the resist film.

A method of manufacturing semiconductor device using a pattern data generating method according to yet another aspect of the present invention is a method for correcting pattern data on a mask pattern to be transferred to a resist film, which is characterized by including the steps of: applying a Fourier transform to the intensity distribution of the optical image formed in a resist by transferring the mask pattern in a periodic direction of the intensity distribution of the optical image, and applying a spectral transform to the intensity distribution of the optical image in an aperiodic direction of the intensity distribution of the optical image by use of a base which satisfies a boundary condition; applying a Fourier transform to a modulation function for modulating the intensity distribution of the optical image, in the periodic direction of the intensity distribution of the optical image, and applying a spectral transform to the modulation function in the aperiodic direction of the intensity distribution of the optical image by use of the base which satisfies the boundary condition; computing a product of the post-transformed intensity distribution of the optical image and the post-transformed modulation function; applying an inverse Fourier transform to the thus-found product in the periodic direction of the intensity distribution of the optical image, and applying an inverse spectral transform to the resultant product in the aperiodic direction of the intensity distribution of the optical image by use of a base corresponding to the inverse transform of the spectral transform, thereby calculating a modulated intensity distribution of the optical image; estimating the shape of a pattern to be formed in the resist film, on the basis of the thus-modulated intensity distribution of the optical image; obtaining a dimensional difference between the thus-estimated pattern and a design pattern to be formed in the resist film; correcting the pattern data on the mask pattern in a case where the dimensional difference does not satisfy a desired condition; and transferring the mask pattern based on the pattern data.

The present invention is capable of providing a simulation method and program which are both capable of fast and accurately estimating the intensity distribution of an optical image to be formed in a resist film, as well as a method for fast and accurately generating pattern data by use of the simulation method.

DETAILED DESCRIPTION OF THE PREFERRED EMBODIMENTS

Figure 1:
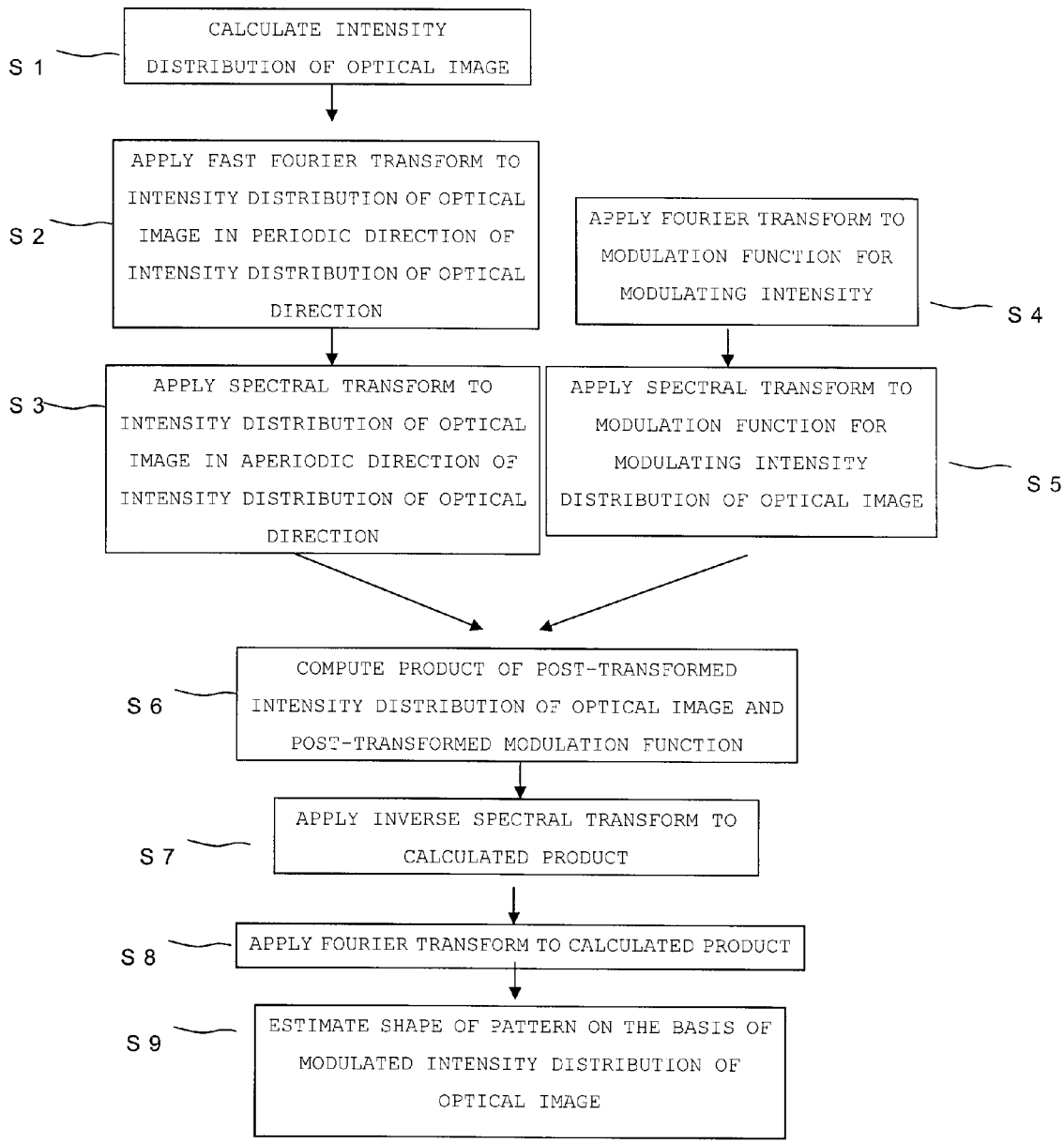
FIG. 1 is a flowchart showing a simulation method according to Embodiment 1 of the present invention.

Descriptions will be provided hereinbelow for a method and program both for simulating the intensity distribution of an optical image as well as a pattern data generating method according to embodiments of the present invention by referring to the drawings.

Embodiment 1

The simulation method according to Embodiment 1 is that for calculating the intensity distribution of an optical image to be formed in a resist film on a semiconductor substrate by photolithography.

A characteristic of the simulation method according to the present embodiment is that, as means for solving a diffusion equation indicating the diffusion of an acid generated in the resist film, a fast Fourier transform is applied to the intensity distribution of the optical image in a direction which satisfies a periodic boundary condition of the intensity distribution of the optical image, whereas a spectral transform is applied to the intensity distribution of the optical image by use of a basis set which satisfies a boundary condition of the diffusion equation in a direction which does not satisfy the periodic boundary condition of the intensity distribution of the optical image.

Referring to FIG. 1, descriptions will be provided for the simulation method according to the present embodiment. FIG. 1 shows a flowchart of the simulation method according to the present embodiment. Note that the use of the simulation method according to the present embodiment makes it possible to estimate the shape of a resist pattern from a finally-calculated intensity distribution of the optical image.

First of all, calculated is the intensity distribution of an optical image to be obtained by transferring a mask pattern formed in a photomask to the resist film on the semiconductor substrate by use of an exposure system (in step S1).

The intensity distribution of the optical image is calculated on the basis of optical information on the system, information on multiple films formed on the substrate, information on the mask pattern, and the like. Examples of the optical information on the system include the wavelength of the exposure light, the numerical aperture of the projection optical lens, the shape of illumination, the phase, the aberration, the pupil transmittance and the mask transmittance. The information on multiple films is information on multiple films formed on the substrate, such as the resist film, an antireflection film provided on the top or back of the resist film, a resist protecting film provided on the top of the resist film, as well as a hard mask, an etching stopper, an interlayer dielectric and an electrically-conductive layer provided under the resist film. More specifically, the information on multiple films is information on the materials, index of refraction, film thickness, and the like, of each of these films. The information on the mask pattern is information on the shape (for example, the pattern width and the pattern space), arrangement, coverage factor, and the like, of the pattern formed in the mask.

Figure 2:
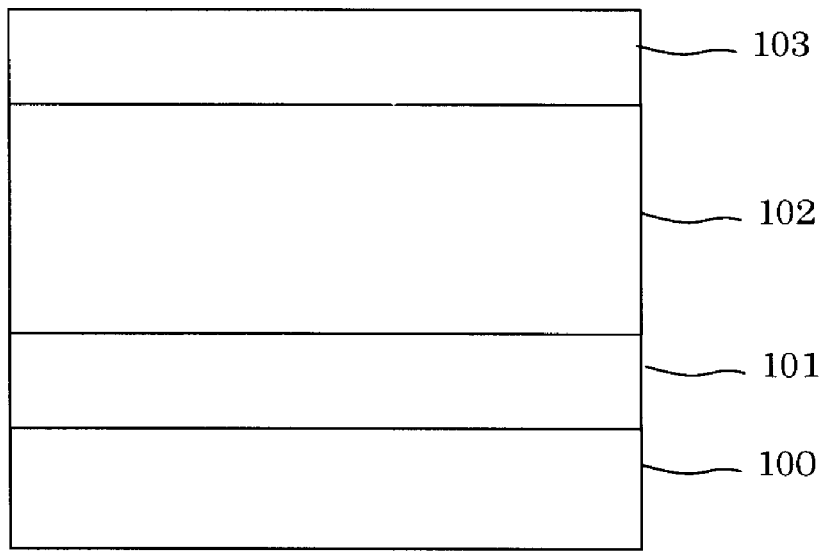
FIG. 2 is a cross-sectional view of multiple films formed on a semiconductor substrate according to Embodiment 1 of the present invention.

FIG. 2 shows a cross-sectional structure of the multiple films including the resist film to which the simulation method according to the present embodiment is applied. Specifically, the cross-sectional structure of the multiple films is a structure of an antireflection film 101, a resist film 102 and a protective film 103 sequentially formed on a semiconductor substrate 100. The resist film 102 is a chemically-amplified resist film. An acid generated in the resist film 102 by exposure is diffused in the resist film 102 by post-exposure bake.

Figure 3:
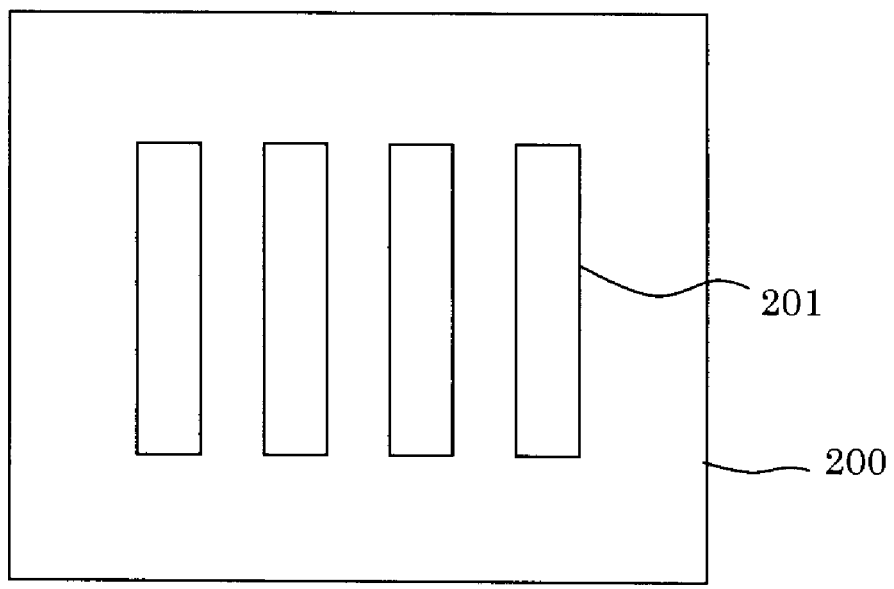
FIG. 3 is a plan view of a mask in which a mask pattern is formed according to Embodiment 1 of the present invention.

On the other hand, as shown in FIG. 3, the structure of the mask pattern applied to the present embodiment is a line-and-space pattern including line patterns 201 which are repeated periodically in the surface direction of a mask 200. In this respect, the width w of each pattern and the width l of the space between two neighboring patterns are both set at approximately some tens nanometers.

The intensity distribution of the optical image calculated through simulation on the basis of the above-described information is a periodic distribution in the surface direction of the resist film, because the mask pattern to be transferred to the resist film includes the patterns periodically arranged (or an alternate series of lines and spaces) in the surface direction of the mask. On the other hand, the intensity distribution of the optical image in the film thickness direction of the resist film is an aperiodic distribution, because the intensity distribution of the optical image in the film thickness direction thereof can not satisfy the periodic boundary condition as a result of facts that the materials for a film (or the protective film) formed on the top of the resist film is different from the materials for a film (or the antireflection film) formed on the back of the resist film.

Subsequently, a fast Fourier transform is applied to the intensity distribution of the optical image in the periodic direction of the intensity distribution of the optical image (or in the surface direction of the resist film) (in step S2). Because the intensity distribution of the optical image in the surface direction of the resist film is the periodic distribution, a fast and accurate Fourier transform can be applied to the intensity distribution of the optical image in the surface direction thereof.

Thereafter, a spectral transform is applied to the intensity distribution of the optical image to which the Fourier transform has been applied, in the aperiodic direction of the intensity distribution of the optical image, for example, in the film thickness direction of the resist film by setting up a base which satisfies a boundary condition (in step S3). Because the intensity distribution of the optical image in the film thickness direction of the resist film is the aperiodic distribution, no Fourier transform can be applied to the intensity distribution of the optical image in the film thickness direction of the resist film. However, the spectral transform can be applied to the intensity distribution of the optical image in the film thickness direction of the resist film by setting up such a base as to satisfy the boundary condition.

The boundary condition used in the present embodiment is that: the diffusant in the resist film is the acid; the acid generated in the resist continues to be conserved in the resist film; and the acid never diffuses to films provided on the top or the back of the resist film. In this case, a Chebyshev transform can be used for the spectral transform in the film thickness direction. Moreover, the Chebyshev transform can be easily performed by use of a discrete cosine transform (DCT).

Descriptions will be provided for a Chebyshev transform by use of specific equations. An expansion of a Chebyshev series is defined as (Equation 1)

$$f(z) = \Sigma \alpha_n T_n(z) \quad (1)$$

and can express the distribution of the concentration of the diffusion in the resist film.

Furthermore, by use of a cosine with change of variables, the Chebyshev series can be expressed with (Equation 2)

$$T_n(z) = \cos(n\theta) \quad (2)$$

When, as shown above, only the cosine is used as a basis set, the distribution of the concentration of the diffusion of the acid in the boundary of the resist film can be expressed with (Equation 3)

$$\frac{\partial f}{\partial z} = 0 \quad (3)$$

It is learned from this that the boundary condition defined for the present embodiment, for example, the condition that the diffused acid continues to be conserved in the resist film is satisfied.

Because, as shown above, the Chebyshev series indicating the distribution of the diffusion of the acid is expressed by use of cosine with change of variables, the Chebyshev transform can be performed fast by use of a discrete cosine transform expressed with (Equation 4)

$$X_k = \sum_{n=0}^{N-1} x_n \cos\left[\frac{\pi}{N}\left(n + \frac{1}{2}\right)k\right] \quad (4)$$

As described above, the distribution in the frequency space can be calculated.

In the present embodiment, the Fourier transform is applied to the intensity distribution of the optical image in the periodic direction thereof (in step S2), and thereafter the spectral transform is applied to the intensity distribution of the optical image to which the Fourier transform has been applied, in the aperiodic direction thereof (in step S3). Instead, the sequence with which these transforms are applied may be the other way round. Specifically, the spectral transform may be beforehand applied to the intensity distribution of the optical image in the aperiodic direction thereof, and thereafter the Fourier transform may be applied to the intensity distribution of the optical image to which the spectral transform has been applied, in the periodic direction thereof.

After that, the intensity distribution of the optical image to which the spectral transform has been applied as described above is modulated by use of a function for modulating the intensity distribution of the optical image, for example, a Gaussian function or the like expressing the diffusion of the acid in the resist film. Descriptions will be provided hereinbelow for a step of modulating the intensity distribution of the optical image.

First of all, a fast Fourier transform is applied to the function for modulating the intensity distribution of the optical image in the aforementioned periodic direction of the intensity distribution of the optical image (in step S4).

Subsequently, a spectral transform is applied to the modulation function to which the Fourier transform has been applied (in step S5). In this respect, the spectral transform is applied to the modulation function to which the Fourier transform has been applied, in the aforementioned aperiodic direction of the intensity distribution of the optical image by use of the same base (cosine) as is used in the step of applying the spectral transform to the intensity distribution of the optical image. This makes it possible to express the modulation function in the same frequency space as that of the intensity distribution of the optical image.

Note that the sequence with which the transforms are applied to the modulation function (in steps S4 and S5) may be the other way round. Specifically, the spectral transform may be applied to the modulation function in the aperiodic direction of the intensity distribution of the optical image, and thereafter the Fourier transform may be applied to the modulation function to which the spectral transform has been applied, in the periodic direction of the intensity distribution of the optical image.

Subsequently, a product of the intensity distribution of the optical image to which the spectral transform has been applied and the modulation function to which the spectral transform has been applied is computed (in step S6).

Thereafter, an inverse spectral transform is applied to the calculated product in the aforementioned aperiodic direction of the intensity distribution of the optical image by use of the same base (cosine) as is used in the steps of applying the spectral transform (in step S7). The inverse spectral transform can be performed fast by use of an inverse discrete cosine transform expressed with (Equation 5)

$$X_k = \frac{1}{2}x_0 + \sum_{n=1}^{N-1} x_n \cos\left[\frac{\pi}{N}n\left(k+\frac{1}{2}\right)\right] \quad (5)$$

After that, an inverse fast Fourier transform is applied to the product to which the inverse spectral transform has been applied in the aforementioned periodic direction of the intensity distribution of the optical image, and thereby a modulated intensity distribution of the optical image is calculated (in step S8). Note that, like the sequences such as the sequence with which the transforms are applied to the intensity distribution of the optical image, the sequence with which the transforms are applied to the product (in steps S7 and S8) may be the other way round. Even in this case, the modulated intensity distribution of the optical image may be calculated.

Subsequently, on the basis of the modulated intensity distribution of the optical image, the shape of a pattern to be formed in the resist film is estimated (in step S9).

Figure 4:
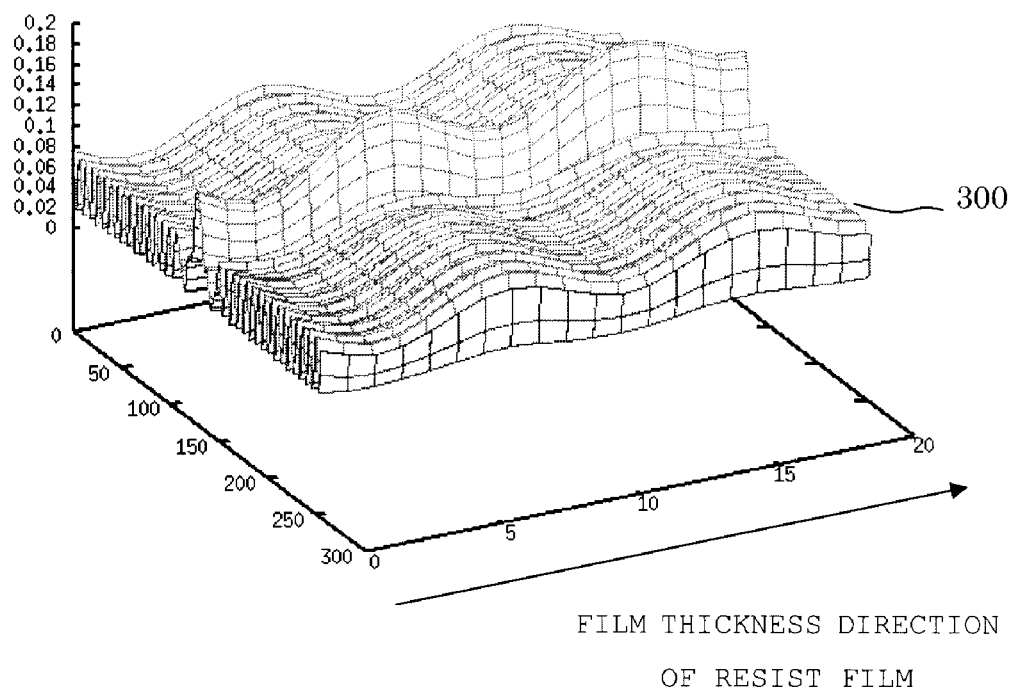
FIG. 4 is a diagram showing a pre-modulated intensity distribution of an optical image to be formed in a resist film according to Embodiment 1 of the present invention.
Figure 5:
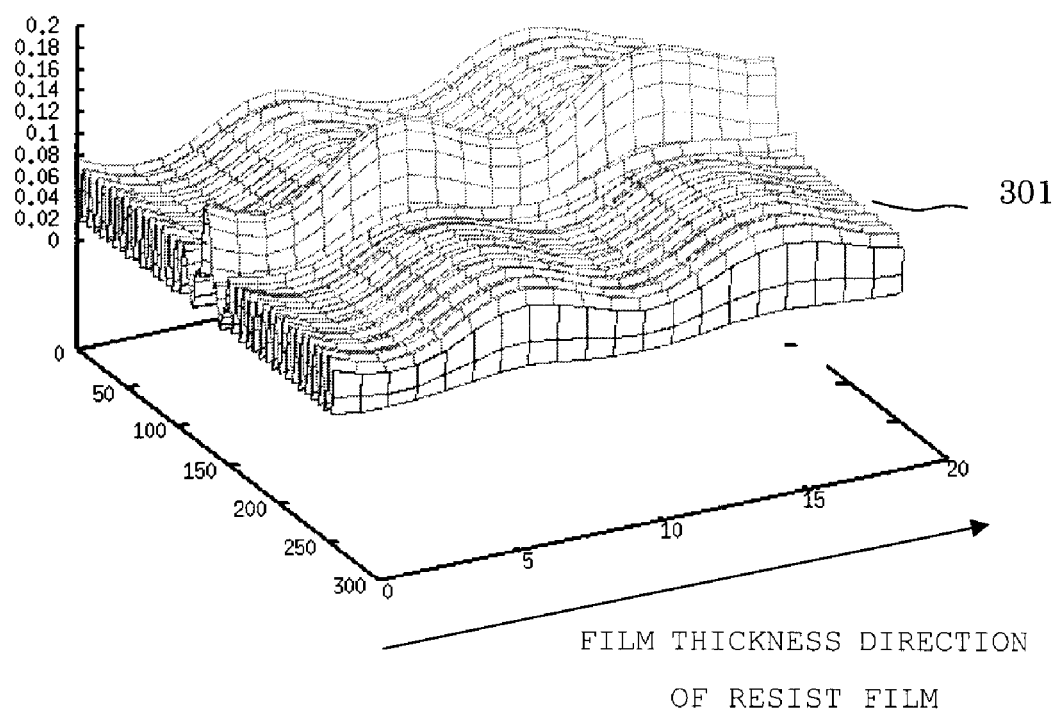
FIG. 5 is a diagram showing a post-modulated intensity distribution of the optical image to be formed in the resist film according to Embodiment 1 of the present invention.

A result of an intensity distribution of an optical image which is obtained by use of the simulation method according to the present embodiment will be shown. FIG. 4 illustrates a result of making an optical computation by use of a mask pattern having an alternate series of lines and spaces, and shows a distribution 300 of intensity of an optical image to be formed in the resist film. FIG. 5 shows a distribution 301 of intensity of an optical image which is obtained through modulating the distribution 300 of the intensity of the optical image shown in FIG. 4 by applying the simulation method according to the present embodiment.

From this result of the simulation, it is learned that the total sum of the pre-modulated distribution 300 of the intensity of the optical image shown in FIG. 4 is equal to the total sum of the post-modulated distribution 301 of the intensity of the optical image shown in FIG. 5. In addition, it is learned that problems such as aliasing do not occur with the numerical calculation in the aperiodic boundary in the film thickness direction. This is because, in the boundary condition set up for the spectral transform according to the present embodiment, the total sum of the intensity of the optical image in the resist film, which is obtained from the post-modulated distribution 301 of the intensity of the optical image, should be equal to the total sum of the intensity of the optical image in the resist film, which is obtained from the pre-modulated distribution 300 of the intensity of the optical image.

As described above, the simulation method according to the present embodiment makes it possible to solve the diffusion equation by use of the fast Fourier transform and the spectral transform, and to fast and accurately calculate the intensity distribution of the optical image with no aliasing being caused by setting up the predetermined boundary condition.

Embodiment 2

Figure 6:
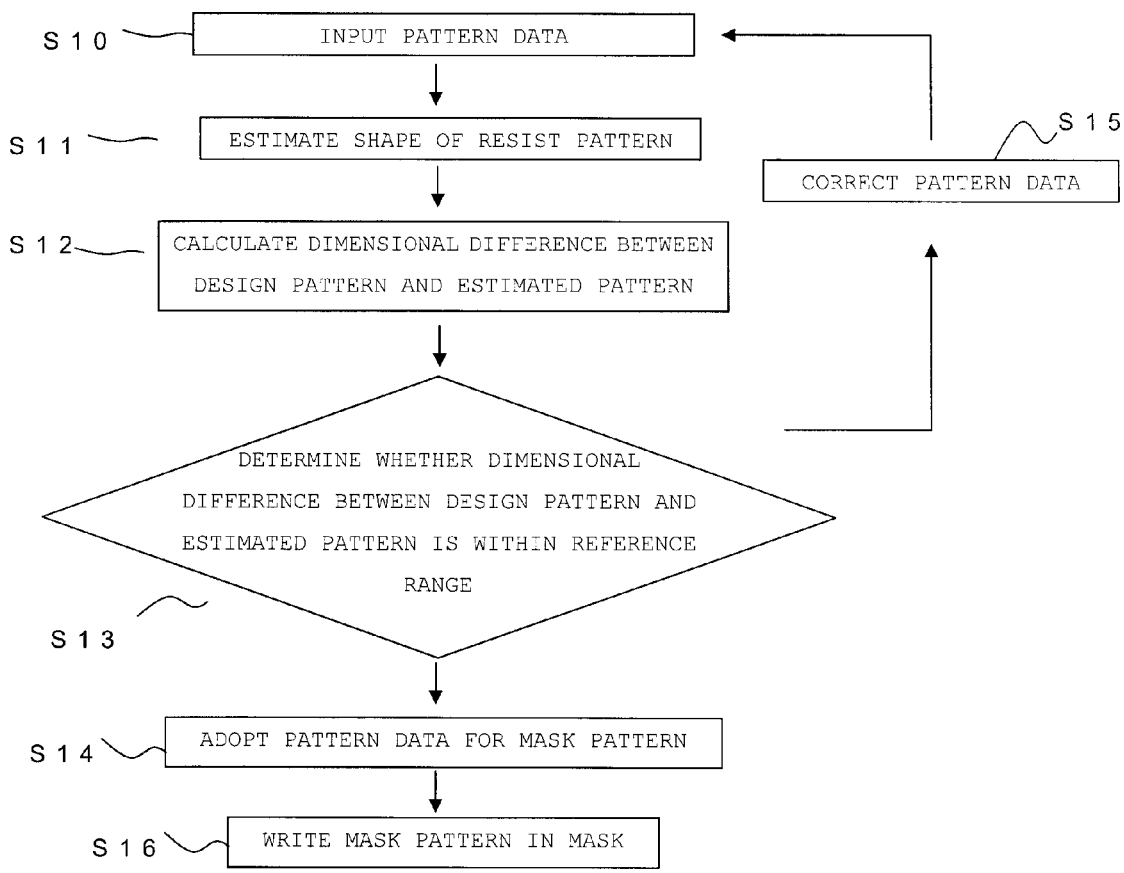
FIG. 6 is a flowchart showing a pattern data generating method according to Embodiment 2 of the present invention.

As to the present embodiment, descriptions will be provided for a method for generating data on a pattern to be formed in a mask by use of the simulation method according to Embodiment 1. FIG. 6 is a flowchart showing the pattern data generating method according to the present embodiment. Note that a step of estimating the shape of a pattern used in the pattern data generating method according to the present embodiment is carried out by the same scheme as the step of estimating the shape of a pattern used in the simulation method according to Embodiment 1 is carried out. For this reason, descriptions for the step of estimating the shape of a pattern in the present embodiment will be omitted.

First of all, as shown in FIG. 6, pattern data on the mask pattern is inputted in the simulation tool (in step S10). The pattern data on the mask pattern is beforehand designed in order that a resist pattern should be shaped as designed when the resist pattern is formed by transferring the mask pattern to a resist film by lithography, and thereafter by developing the resist film.

Subsequently, by use of the simulation method according to Embodiment 1, on the basis of the pattern data, the shape of the resist pattern is estimated (in step S11)

Thereafter, the dimensions of the estimated resist pattern are measured, and thus the dimensional difference between the estimated resist pattern and the design pattern intended to be formed in the resist film is calculated (in step S12).

After that, it is determined whether or not the dimensional difference between the design pattern and the estimated resist pattern satisfies a desired condition, for example, whether or not the dimensional difference is less than a reference value (in step S13). The reference value by which the dimensional difference is judged is set up appropriately as an allowable error satisfying the required characteristics depending on the necessity in terms of the following criteria including: whether or not the design rule defined by the limit of resolution for the lithography, the limit of process such as the limit of fabrication, and the like, can be observed; whether or not the process tolerance can be secured fully; and whether or not the interconnection capacity is within the specification scope.

In a case where the dimensional difference between the design pattern and the estimated resist pattern is determined to be equal to, or less than, the desired reference value, the pattern data is adopted for the mask pattern (in step S14).

On the other hand, in a case where the dimensional difference between the design pattern and the estimated resist pattern is determined to be more than the desired reference value, the pattern data is corrected (in step S15).

In a case where the pattern data is corrected, the pattern data thus corrected is inputted in the simulation tool again (in step S10). Subsequently, the shape of the pattern is estimated (in step S11). Thereafter, the step S12 and the steps coming after the step S12 are repeated until the dimensional difference between the estimated resist pattern and the design pattern becomes equal to, or less than, the desired reference value.

After, as described above, the pattern data is adopted for the mask pattern, the pattern contained in the pattern data is written onto a mask substrate by use of an electron beam lithography system, and thereby the mask pattern is formed (in step S16).

This pattern data generating method makes it possible to correct the pattern data fast and accurately, because the pattern data generating method uses the simulation method according to Embodiment 1, which is capable of estimating the intensity distribution of the optical image fast and accurately.

In addition, after the mask pattern is formed in the mask, semiconductor devices can be manufactured by use of this mask. The mask is irradiated by use of an aligner, and thus the mask pattern is transferred to the resist film on the semiconductor substrate through a projection optical system. Subsequently, the resist film is developed by use of a developer. Thereby, the resist pattern is formed. Thereafter, a process-target film under the resist film is etched by using the resist pattern as the mask. Thereby, it is possible to doing things such as separating elements, forming groove patterns for interconnections or holes, and forming gate patterns.

The simulation method according to Embodiment 1 and the pattern data generating method according to Embodiment 2 are capable of being implemented by a computer whose operation is controlled by a program in which their steps are described. The program can be provided through a recording media such as a magnetic disc or through a communications line (a wired communications line or a wireless communications line) such as the Internet.

The foregoing descriptions have been provided for the embodiments of the present invention. However, the present invention is not limited to the embodiments. The present invention can be carried out variously without departing from the scope or spirit of the present invention. Moreover, the embodiments include various stages of the invention, and various inventions can be extracted from appropriate combinations of a plurality of the components disclosed herein. For example, even if some components are deleted from all the components shown in the embodiments, as far as any one of the predetermined effects is obtained, the resultant components can be extracted as an invention.

What is claimed is:

1. A method for simulating an intensity distribution of an optical image, comprising the steps of:
    applying a Fourier transform to the intensity distribution of the optical image formed in a resist film in a periodic direction of the intensity distribution of the optical image, and applying a spectral transform to the intensity distribution of the optical image in an aperiodic direction of the intensity distribution of the optical image by use of a base which satisfies a boundary condition;
    applying a Fourier transform to a modulation function for modulating the intensity distribution of the optical image, in the periodic direction of the intensity distribution of the optical image, and applying a spectral transform to the modulation function in the aperiodic direction of the intensity distribution of the optical image by use of the base which satisfies the boundary condition;
    computing a product of the post-transformed intensity distribution of the optical image and the post-transformed modulation function; and
    applying an inverse Fourier transform to the thus-found product in the periodic direction of the intensity distribution of the optical image, and applying an inverse spectral transform to the resultant product in the aperiodic direction of the intensity distribution of the optical image by use of a base corresponding to an inverse transform of the spectral transform, thereby calculating a modulated intensity distribution of the optical image.

2. The method for simulating an intensity distribution of an optical image as recited in claim 1, wherein
    in the step of applying the spectral transform to the intensity distribution of the optical image, a discrete cosine transform with a cosine function as its base is used if a condition as a boundary condition is satisfied in which a total sum of the intensity of the optical image in the resist film obtained from the modulated intensity distribution of the optical image is equal to a total sum of the intensity of the optical image in the resist film in the pre-modulated intensity distribution of the optical image.

3. The method for simulating an intensity distribution of an optical image as recited in any one of claim 1, wherein
    the modulation function is a Gaussian function.

4. The method for simulating an intensity distribution of an optical image as recited in claim 1, wherein
    in the step of applying the spectral transform to the intensity distribution of the optical image, a Chebyshev transform is used.

5. A non-transitory computer-readable storage medium with an executable program for simulating an intensity distribution of an optical image, the program causing a computer to execute the steps of:
    applying a Fourier transform to the intensity distribution of the optical image formed in a resist film in a periodic direction of the intensity distribution of the optical image, and applying a spectral transform to the intensity distribution of the optical image in an a periodic direction of the intensity distribution of the optical image by use of a base which satisfies a boundary condition;
    applying a Fourier transform to a modulation function for modulating the intensity distribution of the optical image in the periodic direction of the intensity distribution of the optical image, and applying a spectral transform to the modulation function in the a periodic direction of the intensity distribution of the optical image by use of the base which satisfies the boundary condition;
    computing a product of the post-transformed intensity distribution of the optical image and the post-transformed modulation function; and
    applying an inverse Fourier transform to the thus-found product in the periodic direction of the intensity distribution of the optical image, and applying an inverse spectral transform to the resultant product in the a periodic direction of the intensity distribution of the optical image by use of a base corresponding to an inverse transform of the spectral transform, thereby calculating a modulated intensity distribution of the optical image.

6. A method of manufacturing semiconductor device using a method for generating pattern data on a mask pattern to be transferred to a resist film, comprising the steps of:
    applying a Fourier transform to the intensity distribution of the optical image formed in a resist film by transferring the mask pattern in a periodic direction of the intensity distribution of the optical image, and applying a spectral transform to the intensity distribution of the optical image in an aperiodic direction of the intensity distribution of the optical image by use of a base which satisfies a boundary condition;
    applying a Fourier transform to a modulation function for modulating the intensity distribution of the optical image in the periodic direction of the intensity distribution of the optical image, and applying a spectral transform to the modulation function in the aperiodic direction of the intensity distribution of the optical image by use of the base which satisfies the boundary condition;

computing a product of the post-transformed intensity distribution of the optical image and the post-transformed modulation function;

applying an inverse Fourier transform to the thus-found product in the periodic direction of the intensity distribution of the optical image, and applying an inverse spectral transform to the resultant product in the aperiodic direction of the intensity distribution of the optical image by use of a base corresponding to an inverse transform of the spectral transform, thereby calculating a modulated intensity distribution of the optical image;

estimating a shape of a pattern to be formed in the resist film, on the basis of the thus-modulated intensity distribution of the optical image;

obtaining a dimensional difference between the thus-estimated pattern and a design pattern to be formed in the resist film; and correcting pattern data on the mask pattern in a case where the dimensional difference does not satisfy a desired condition;

transferring the mask pattern based on the pattern data.

* * * * *